US011498260B2

(12) United States Patent
Nawata

(10) Patent No.: US 11,498,260 B2
(45) Date of Patent: Nov. 15, 2022

(54) IMPRINT METHOD AND METHOD FOR MANUFACTURING ARTICLE

(71) Applicant: CANON KABUSHIKI KAISHA, Tokyo (JP)

(72) Inventor: Ryo Nawata, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 34 days.

(21) Appl. No.: 15/931,396

(22) Filed: May 13, 2020

(65) Prior Publication Data

US 2020/0376741 A1 Dec. 3, 2020

(30) Foreign Application Priority Data

May 31, 2019 (JP) .............................. JP2019-102882

(51) Int. Cl.
| | |
|---|---|
| *B29C 59/02* | (2006.01) |
| *B29C 33/42* | (2006.01) |
| *B29C 35/08* | (2006.01) |
| *H01L 21/027* | (2006.01) |
| *H01L 21/266* | (2006.01) |
| *H01L 21/308* | (2006.01) |

(52) U.S. Cl.
CPC .......... *B29C 59/026* (2013.01); *B29C 33/424* (2013.01); *B29C 35/0805* (2013.01); *H01L 21/0273* (2013.01); *H01L 21/266* (2013.01); *H01L 21/3086* (2013.01)

(58) Field of Classification Search
None
See application file for complete search history.

(56) References Cited

U.S. PATENT DOCUMENTS

| | | | | |
|---|---|---|---|---|
| 2006/0139593 A1* | 6/2006 | Nagasaka | ............... | G03F 7/709 355/53 |
| 2009/0148782 A1* | 6/2009 | Kono | .................. | G03F 7/70425 430/5 |
| 2009/0224436 A1* | 9/2009 | Mikami | ................. | B82Y 10/00 264/447 |
| 2011/0143271 A1* | 6/2011 | Koshiba | ................. | B82Y 40/00 430/30 |
| 2016/0346962 A1* | 12/2016 | Kawamura | ........... | B29C 33/424 |

FOREIGN PATENT DOCUMENTS

JP 2016-58735 A 4/2016

\* cited by examiner

*Primary Examiner* — Kelly M Gambetta
*Assistant Examiner* — Virak Nguon
(74) *Attorney, Agent, or Firm* — Canon U.S.A., Inc. I.P. Division

(57) ABSTRACT

An imprint method includes bringing a mold and an uncured imprint material supplied onto a substrate into contact with each other, enhancing viscoelasticity of the imprint material, making position adjustment of the mold and the substrate, and curing the imprint material. The imprint material is supplied onto a shot region of the substrate, and time between bringing the mold brought into contact with the imprint material and starting enhancing viscoelasticity is shorter when the shot region includes an outer periphery of the substrate than when the shot region does not include the outer periphery of the substrate.

21 Claims, 11 Drawing Sheets

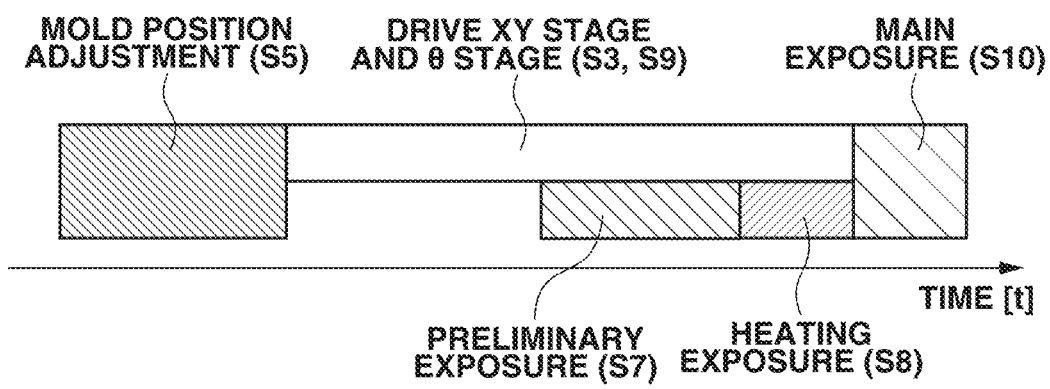
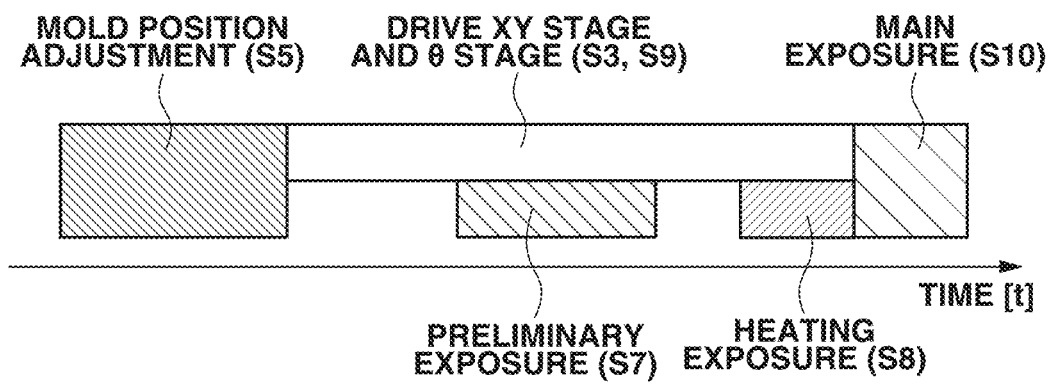

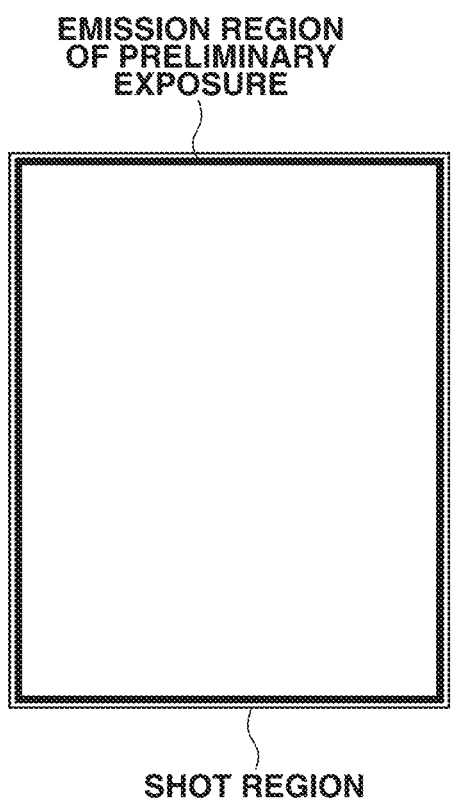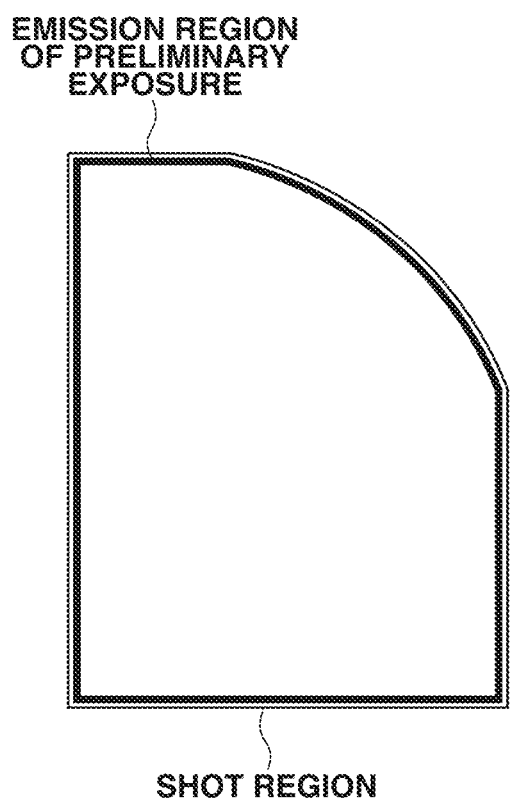

IMPRINT METHOD AND METHOD FOR MANUFACTURING ARTICLE

BACKGROUND

Field of the Disclosure

The present disclosure relates to an imprint method and a method for manufacturing an article.

Description of the Related Art

As a method for manufacturing an article such as a semiconductor device or microelectromechanical systems (MEMS), an imprint method for molding an imprint material on a substrate using a mold is known. In the imprint method, an imprint material is supplied onto a substrate, and the supplied imprint material and a mold are brought into contact with (pressed against) each other. After the imprint material is cured in the state where the imprint material and the mold are in contact with each other, the mold is pulled away (released) from the cured imprint material, thereby the pattern of the imprint material is formed on the substrate.

In an imprint technique, curing methods for curing an imprint material include a light curing method. In the light curing method, light is emitted to an imprint material (hereinafter, "main exposure") in a state where the imprint material supplied onto a shot region on a substrate and a mold are in contact with each other, thereby the imprint material is cured. The mold is then pulled away from the cured imprint material, thereby the pattern of the imprint material is formed on the substrate.

In a process of manufacturing a semiconductor device, a plurality of patterns is overlaid on each other. Thus, it is necessary to adjust a position of a shot region (a pattern) formed on a substrate and a position of a pattern formed on a mold. The accuracy of the position adjustment of the substrate and the mold is termed "overlay accuracy". In an imprint apparatus, a technique for improving overlay accuracy is conventionally discussed. Such a technique is discussed in Japanese Patent Application Laid-Open No. 2016-58735. In the technique, exposure for enhancing viscoelasticity of the imprint material (hereinafter, "preliminary exposure") is performed in a state where an imprint material and a mold are in contact with each other before a curing step. In a state where the viscoelasticity is enhanced, a position adjustment of the mold and a substrate is performed. This can reduce the relative vibration between the mold and the substrate. Thus, it is possible to improve overlay accuracy.

In an imprint apparatus discussed in Japanese Patent Application Laid-Open No. 2016-58735, the preliminary exposures are performed under a same emission condition for a shot region including an outer peripheral region (an edge region) of the substrate and a shot region that does not include the outer peripheral region (the edge region) of the substrate. However, the areas of the shot region including the outer periphery of the substrate and the shot region that does not include the outer periphery of the substrate are different from each other. Thus, even if the preliminary exposure is performed under a same emission condition on the shot region including the outer periphery of the substrate and the shot region that does not include the outer periphery of the substrate, the viscoelasticity of the imprint material may not be increased on the shot region including the outer periphery of the substrate. Accordingly, the relative vibration may not become small. If, on the other hand, the preliminary exposure is performed on the shot region including the outer periphery of the substrate under an emission condition suitable for the shot region that does not include the outer periphery of the substrate, the viscoelasticity of the imprint material may become too high, and it may be difficult to make the position adjustment of the mold and the substrate.

SUMMARY

According to an aspect of the present disclosure, an imprint method for forming a pattern of an imprint material on a substrate using a mold includes bringing the mold and the imprint material supplied onto the substrate into contact with each other, enhancing viscoelasticity of the imprint material, making position adjustment of the mold and the substrate, and curing the imprint material. The imprint material is supplied onto a shot region of the substrate, and time between bringing the mold brought into contact with the imprint material and starting enhancing viscoelasticity is shorter when the shot region includes an outer periphery of the substrate than when the shot region does not include the outer periphery of the substrate.

Further features of the present invention will become apparent from the following description of exemplary embodiments with reference to the attached drawings.

BRIEF DESCRIPTION OF THE DRAWINGS

FIGS. 4A and 4B are diagrams each illustrating a time series of the imprint process according to the first exemplary embodiment.

FIGS. 10A and 10B are diagrams each illustrating an irradiation region for preliminary exposure of a shot region.

DESCRIPTION OF THE EMBODIMENTS

Figure 1A:
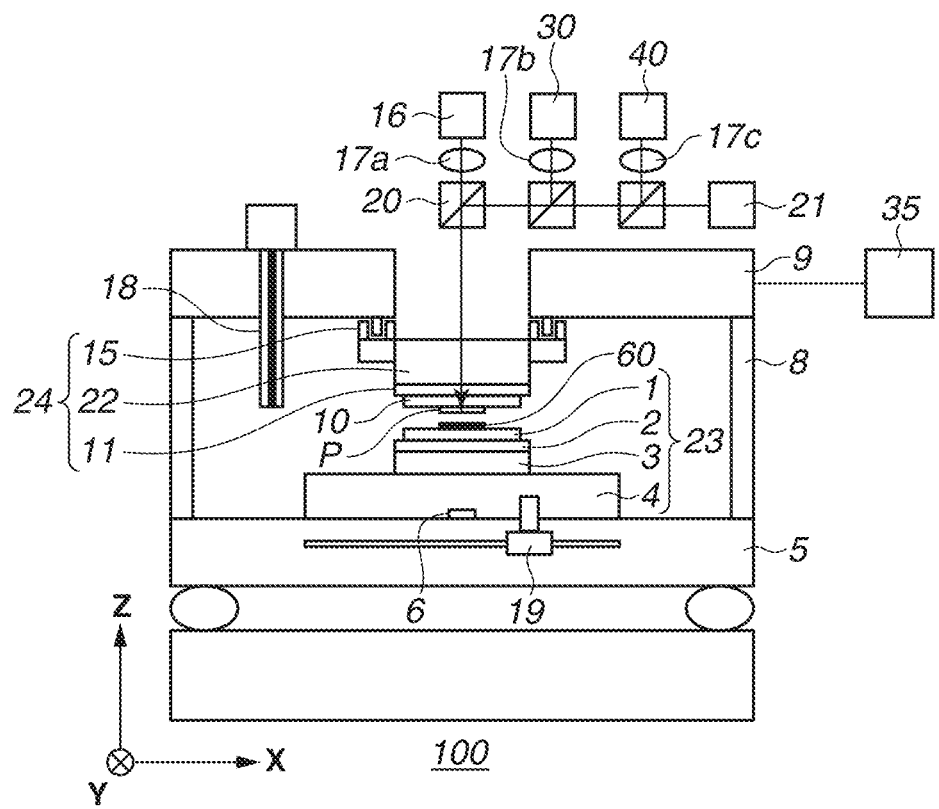
FIGS. 1A and 1B are schematic diagrams illustrating a configuration of an imprint apparatus according to a first exemplary embodiment.

Desirable exemplary embodiments of the present invention will be described in detail below with reference to the attached drawings. In the drawings, similar members are designated by the same reference numbers, and are not redundantly described.

Figure 1B:
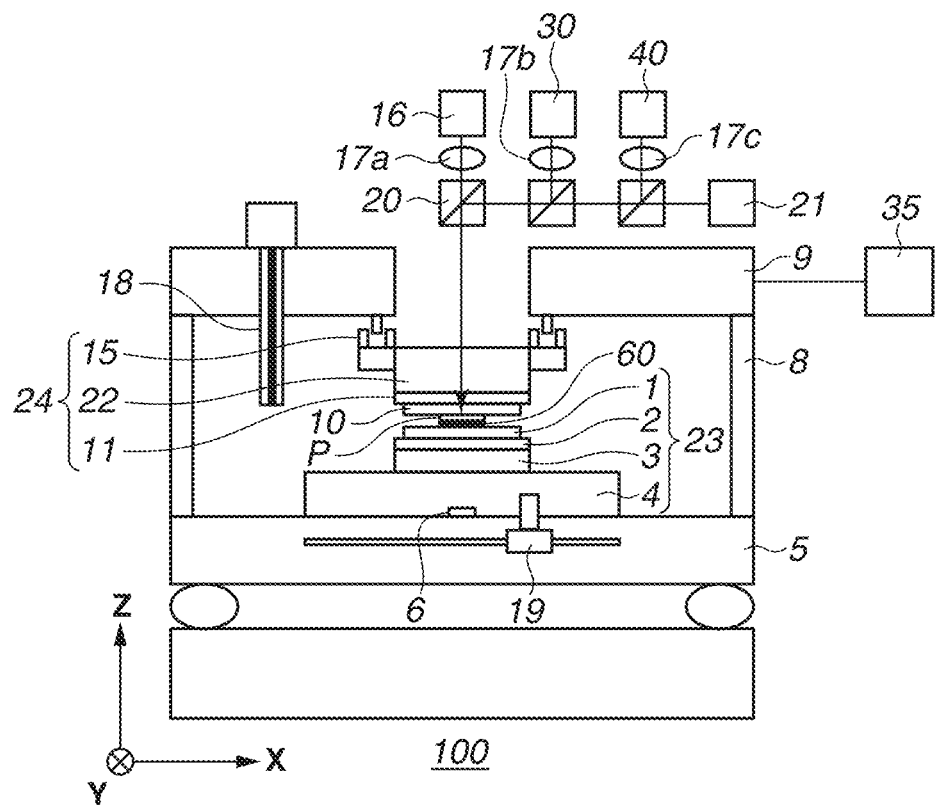

FIGS. 1A and 1B are schematic diagrams illustrating a configuration of an imprint apparatus 100 according to a first exemplary embodiment. The configuration of the imprint apparatus 100 is described with reference to FIGS. 1A and 1B. FIG. 1A illustrates a state before a mold 10 and an imprint material 60 on a substrate 1 come into contact with each other. FIG. 1B illustrates the state where the mold 10 and the imprint material 60 on the substrate 1 are in contact with each other. In the following figures, an X-axis and a Y-axis orthogonal to each other are defined in a plane parallel to the surface of the substrate 1, and a Z-axis is defined as a direction perpendicular to the X-axis and the Y-axis.

The imprint apparatus 100 includes a substrate holding unit 23 configured to hold the substrate 1, a supply unit 18 configured to supply the imprint material 60, a mold holding unit 24 configured to hold the mold 10, a first light source 16, a second light source 30, a third light source 40, an image capturing unit 21, and a control unit 35. The imprint apparatus 100 is an apparatus that brings the imprint material 60 supplied onto the substrate 1 into contact with the mold 10 and gives curing energy to the imprint material 60, thereby forming the pattern of a cured product to which a concave-convex pattern of the mold 10 is transferred. The imprint apparatus 100 illustrated in FIGS. 1A and 1B is used to manufacture a device such as a semiconductor device as an article. In this case, the imprint apparatus 100 employing a light curing method is described.

The substrate holding unit 23 includes a substrate chuck 2, a θ stage 3 (e.g., a rotational driving mechanism), and an XY stage 4 (e.g., an XY driving mechanism). The substrate chuck 2 holds the substrate 1 with a vacuum suction force or an electrostatic suction force. In FIGS. 1A and 1B, the substrate 1 is held by the substrate chuck 2. The θ stage 3 corrects the position of the substrate 1 in a θ direction (a rotational direction about the Z-axis). The θ stage 3 is placed on the XY stage 4 that positions the substrate 1 in the X-direction and the Y-direction. The XY stage 4 is driven in the X-direction and the Y-direction by a linear motor 19. The θ stage 3 and the XY stage 4 hold the substrate chuck 2, and move the substrate 1 held by the substrate chuck 2. The XY stage 4 is placed on a base 5. A linear encoder 6 is attached on the base 5 in the X-direction and the Y-direction, and measures the position of the XY stage 4. Support columns 8 stand on the base 5 and support a top plate 9.

As the substrate 1, for example, a single-crystal silicon substrate or a silicon on insulator (SOI) substrate is used. Alternatively, as the substrate 1, glass, a ceramic, a metal, a semiconductor, or a resin may be used. On the surface of the substrate 1, a member composed of a different material from the substrate 1 may be formed, where necessary. Specifically, examples of the substrate 1 include a silicon wafer, a compound semiconductor wafer, and quartz glass. On the substrate 1, a plurality of shot regions is formed. On the shot regions, the imprint material 60 is supplied by the supply unit 18. The imprint apparatus 100 repeats an imprint process for forming the pattern of the imprint material 60 on each shot region, and thereby can form the patterns on the entire surface of the substrate 1.

As the imprint material 60, a curable composition that cures by being given curing energy (may also be referred to as "a resin in an uncured state") is used. As the curing energy, an electromagnetic wave can be used. The electromagnetic wave can be light, the wavelength of which is selected from the range of, for example, 10 nm or more and 1 mm or less, such as ultraviolet light. The curable composition can be a composition that cures by being irradiated with light. Among these curable compositions, a photocurable composition that cures by being irradiated with light contains at least a polymerizable compound and a photopolymerization initiator. The photocurable composition may further contain a non-polymerizable compound or a solvent, where necessary. The non-polymerizable compound is at least one type selected from a group of a sensitizer, a hydrogen donor, an internal mold release agent, a surfactant, an antioxidant, and a polymer component. In the present exemplary embodiment, as an example, a photocurable composition having a property of curing with ultraviolet light is used as the imprint material 60. The imprint material 60 can be placed by the supply unit 18 in a droplet-like manner or in an island-like or film-like manner resulting from the connection of a plurality of droplets on the substrate 1. The viscosity (the viscosity at 25° C.) of the imprint material 60 can be, for example, 1 mPa·s or more and 100 mPa·s or less. The imprint material 60 may be applied in a film-like manner onto the substrate 1 with a spin coater or a slit coater.

The supply unit 18 (a dispenser) supplies the imprint material 60 onto the substrate 1. The supply unit 18 includes, for example, a discharge nozzle (not illustrated) and supplies the imprint material 60 from the discharge nozzle onto the substrate 1. In the present exemplary embodiment, the supply unit 18 drops the imprint material 60, as an example, in the form of a liquid on the surface of the substrate 1 to supply the imprint material 60 onto the substrate 1. The amount of the imprint material 60 supplied by the supply unit 18 may be determined depending on the required thickness of the imprint material 60 or the density of a pattern to be formed. The supply unit 18 may not necessarily be provided in the imprint apparatus 100. The supply unit 18A may be supplied the imprint material 60 onto the substrate 1 by a unit outside the imprint apparatus 100.

The mold 10 is a mold for molding the imprint material 60 on the substrate 1. The mold 10 can also be referred to as a "template" or an "original". The mold 10 includes a pattern region P which has, for example, a rectangular outer peripheral portion. In the patter region P, a concave-convex pattern to be transferred to the imprint material 60 supplied onto the substrate 1 is formed into a three-dimensional shape on the surface of the mold 10 opposed to the substrate 1. The pattern region P is also referred to as a "mesa portion". The pattern region P is formed in a protruding portion having a height of several tens to several hundreds of micrometers so that a region other than the pattern region P (a region surrounding the pattern region P) in the mold 10 does not come into contact with the substrate 1. The mold 10 is composed of a material that transmits light (e.g., ultraviolet light) for curing the imprint material 60 on the substrate 1, such as quartz.

The mold holding unit 24 includes a mold chuck 11, a mold stage 22, and a linear actuator 15 (a mold driving mechanism). The mold chuck 11 holds the mold 10 with a vacuum suction force or an electrostatic suction force. The mold chuck 11 is held by the mold stage 22. The mold stage 22 has an adjustment function for adjusting the Z-position of the mold 10, and a tilt function for correcting the tilt of the mold 10. The linear actuator 15 drives the mold 10 held by the mold chuck 11 in the Z-axis direction, brings the mold 10 into contact with the imprint material 60 on the substrate 1, and pulls the mold 10 away from the imprint material 60 on the substrate 1. The linear actuator 15 is, for example, an air cylinder or a linear motor. The mold chuck 11 and the mold stage 22 each have an opening (not illustrated) that transmits light emitted from the first light source 16 to the mold 10.

In the process of curing the imprint material 60 on the substrate 1, the first light source 16 emits light (e.g., ultraviolet light) for curing the imprint material 60 to the substrate 1 through a collimator lens 17a. As the first light source 16, i-line (365 nm) is used. A beam splitter 20 is in the optical path of the first light source 16. The beam splitter 20 separates light used to observe the contact state of the mold 10 by the image capturing unit 21, and light for curing the imprint material 60. The image capturing unit 21 captures the pattern region P of the mold 10 through the beam splitter 20.

In the process of curing the imprint material 60 on the substrate 1, the second light source 30 emits light (e.g., ultraviolet light) for enhancing the viscoelasticity of the imprint material 60 to the substrate 1 through a collimator lens 17b. The second light source 30 can change the illuminance, the irradiation region, and the emission time of light (e.g., ultraviolet light) for curing the imprint material 60. As the second light source 30, a light source having a wavelength of 405 nm is used.

In the process of adjusting the positions of the mold 10 and the substrate 1, the third light source 40 emits light for thermally deforming the substrate 1 to the substrate 1 through a collimator lens 17c. The third light source 40 is aimed at thermally deforming the substrate 1, and therefore has a wavelength range different from that of the second light source 30 that is aimed at enhancing the viscoelasticity of the imprint material 60. As the third light source 40, a light source having a wavelength of 465 nm is used.

The control unit 35 controls the operations and the adjustments of the components included in the imprint apparatus 100. The control unit 35 includes, for example, a computer. The control unit 35 is connected to the components included in the imprint apparatus 100 via a circuit, and can control the components according to a program. The control unit 35 may be provided in the imprint apparatus 100, or may be installed in a different location from the imprint apparatus 100 and remotely control the imprint apparatus 100.

Figure 2:
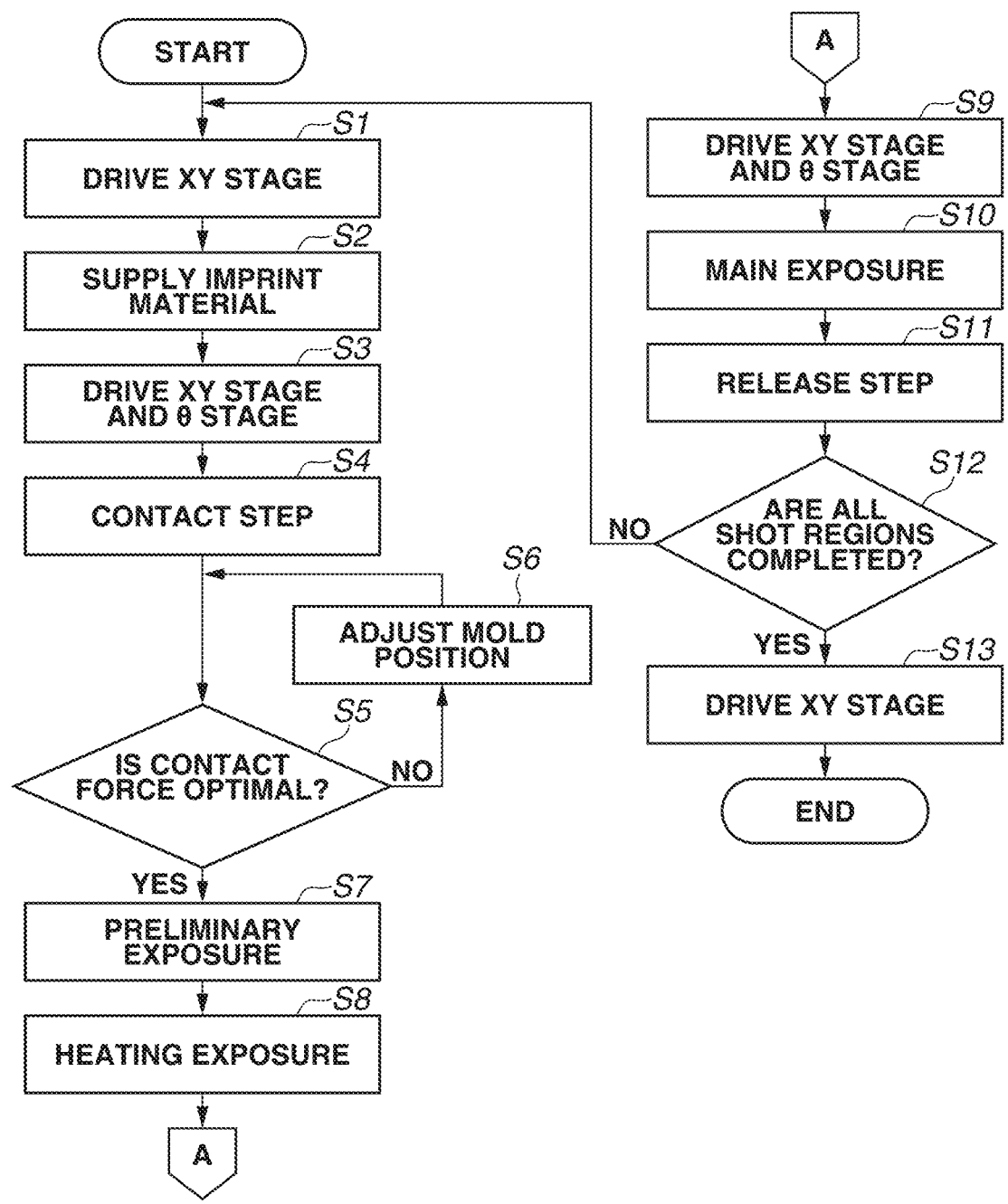
FIG. 2 is a flowchart illustrating an imprint process according to the first exemplary embodiment.

Next, a description is given of an imprint process performed by the imprint apparatus 100 configured as described above. FIG. 2 is a flowchart illustrating an imprint process according to the first exemplary embodiment. The control unit 35 can control the components included in the imprint apparatus 100 by executing steps in the flow chart. In step S1, the control unit 35 drives the XY stage 4 of the imprint apparatus 100, and moves the substrate chuck 2 in which the substrate 1 is placed in the X-direction and the Y-direction, and places a shot region as a target of the imprint process (hereinafter, a "target shot region") beneath the supply unit 18. In step S2, a predetermined amount of the uncured imprint material 60 is supplied onto the substrate 1.

In step S3, the control unit 35 drives the XY stage 4 again, thereby moving the substrate chuck 2 so that the target shot region is placed at a position opposed to the pattern region P of the mold 10. The control unit 35 then drives the θ stage 3, thereby correcting the position in the θ direction of the substrate 1. In step S4, the control unit 35 drives the linear actuator 15, thereby moving the mold stage 22 in the −Z-direction and bringing the mold 10 into contact with the uncured imprint material 60 placed on the substrate 1 (a contact step). In step S4, the control unit 35 may move the substrate holding unit 23 in the Z-direction instead of moving the mold stage 22, or may move each of the mold stage 22 and the substrate holding unit 23. The mold chuck 11 or the mold stage 22 can include a plurality of load cells (not illustrated). In step S5, the control unit 35 determines, based on the output of the plurality of load cells, whether a contact force that occurs when the mold 10 and the uncured imprint material 60 on the substrate 1 are brought into contact with each other is optimal.

If the contact force is not optimal (NO in step S5), the processing proceeds to step S6. In step S6, the mold stage 22 changes the tilt of the mold chuck 11 according to the output from the plurality of load cells such that the contact force of the mold 10 with the imprint material 60 has a predetermined value. Further, the linear actuator 15 changes the pressing amount, thereby adjusting the force for pressing the mold 10 against the imprint material 60.

Figure 3:
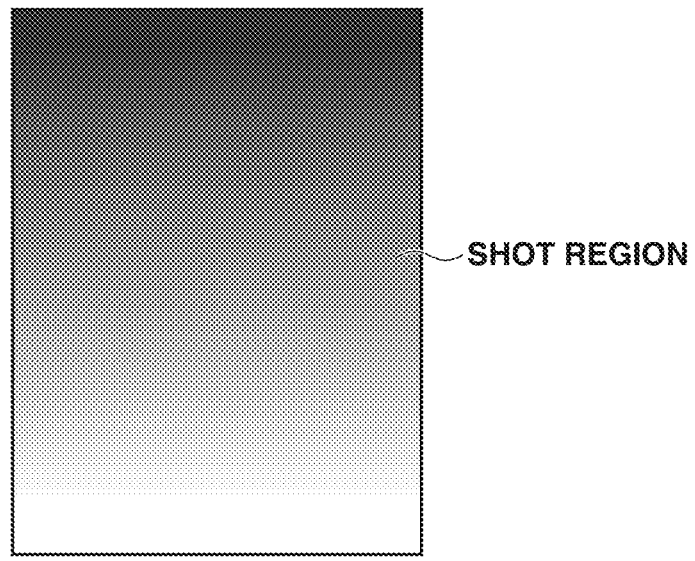
FIG. 3 is a diagram illustrating an illuminance distribution of heating exposure in the imprint process according to the first exemplary embodiment.

If the contact force is optimal (YES in step S5), the processing proceeds to step S7. In step S7, the second light source 30 emits light (e.g., ultraviolet light) to the imprint material 60 on the substrate 1 (preliminary exposure), thereby increasing the viscoelasticity of the imprint material 60. In step S8, the third light source 40 emits light to the substrate 1 (hereinafter, "heating exposure") to thermally deform the substrate 1. In the heating exposure, the light may be emitted to a part of the shot region, or may be emitted to the entirety of the shot region. In a case where the light is emitted to the entirety of the shot region, the illuminance may be distributed as illustrated in FIG. 3. This can thermally deform the substrate 1 into a desired shape. Thus, the position adjustment of the pattern region P of the mold 10 and the shot region on the substrate 1 can be achieved according to a shape at a higher level. Since heat applied in the heating exposure (step S8) is however conducted through the substrate 1 and diffused, it is desirable to perform the heating exposure (step S8) immediately before a main exposure (step S10).

In step S9, alignment marks formed on the mold 10 and the substrate 1 are detected. Based on the measurement results of the detected alignment marks, position adjustment of the mold 10 and the substrate 1 is made. The relative shift between the mold 10 and the substrate 1 is obtained from the measurement results, the XY stage 4 and the θ stage 3 are driven, and thus the position adjustment of the mold 10 and the substrate 1 is made. Although in this case, the preliminary exposure (step S7), the heating exposure (step S8), and the driving of the XY stage 4 and the θ stage 3 (step S9) are performed in this order, these steps may be simultaneously performed.

After the position adjustment of the mold 10 and the substrate 1 is made, then in step S10, the first light source 16 emits light (e.g., ultraviolet light) to the imprint material 60 on the substrate 1 (main exposure), thereby curing the imprint material 60. The irradiation region for the main exposure is the entirety of the shot region. After the emission of light (e.g., ultraviolet light) for a predetermined time, processing proceeds to step S11. In step S11, a release step is performed for driving the linear actuator 15 so that the mold stage 22 is lifted in the +Z-direction and the mold 10 is pulled away from the cured imprint material 60 on the substrate 1. In step S11, the substrate holding unit 23 may be moved in the Z-direction instead of the movement of the mold stage 22, or each of the mold stage 22 and the substrate holding unit 23 may be moved.

In step S12, the control unit 35 determines whether the formation of the patterns on all the shot regions on the substrate 1 is completed. In a case where a shot region on which the pattern of the imprint material 60 is to be formed is left, the processing proceeds to step S1. In step S1, the control unit 35 drives the XY stage 4 to supply the imprint material 60 to the next target shot region, and moves the substrate 1. This series of processes is repeated until the formation of the patterns on all the shot regions on the substrate 1 is completed. If the formation of the patterns on all the shot regions is completed (YES in step S12), the processing proceeds to step S13. In step S13, the control unit 35 drives the XY stage 4 move the substrate 1 to a predetermined position, and the imprint process on a single substrate ends.

FIGS. 4A and 4B each illustrate the time series of a part of the flowchart illustrated in FIG. 2. FIG. 4A is a diagram illustrating the time series of a case where the imprint process is performed on a shot region that does not include the outer periphery of the substrate 1 (also referred to as a "full shot region"). FIG. 4B is a diagram illustrating the time series of a case where the imprint process is performed on a shot region including the outer periphery of the substrate 1 (also referred to as a "partial shot region").

As described above, in the imprint process, light is emitted to each shot region on the substrate 1 for various purposes (e.g., the preliminary exposure, the heating exposure, and the main exposure). A shape of the shot region including the outer periphery of the substrate 1 (refer to FIG. 10B) is different from a shape of the shot region that does not include the outer periphery of the substrate 1 (refer to FIG. 10A). If the shape of the shot region including the outer periphery of the substrate 1 is compared with the shape of the shot region that does not include the outer periphery of the substrate 1, a part of the shot region including the outer periphery of the substrate 1 is missing. Thus, the substrate 1 extends by the heat caused by the emitted light in the main exposure executed in step S10. In a case where light is emitted to the shot region including the outer periphery of the substrate 1, the substrate 1 is likely to extend in the direction in which a part of the shot region is missing. Thus, the accuracy of the position adjustment of the mold 10 and the substrate 1 may dramatically decrease immediately after the main exposure.

In the first exemplary embodiment, as illustrated in FIGS. 4A and 4B, the start time of the preliminary exposure of the shot region including the outer periphery of the substrate 1 (step S7 in FIG. 4B) is earlier than the start time of the preliminary exposure of the shot region that does not include the outer periphery of the substrate 1 (step S7 in FIG. 4A). This promotes curing of the imprint material 60 more on the shot region including the outer periphery of the substrate 1 than on the shot region that does not include the outer periphery of the substrate 1, and thus reduces the relative vibration between the mold 10 and the substrate 1. This can also reduce a dramatic decrease in the accuracy of the position adjustment of the mold 10 and the substrate 1 immediately after the main exposure (step S10) due to the extension of the substrate 1 caused by the heat of the main exposure. Since the time until the preliminary exposure (a viscoelasticity increase step) of the shot region that does not include the outer periphery of the substrate 1 is longer than the time until the preliminary exposure of the shot region including the outer periphery of the substrate 1, it is possible to spend sufficient time for making the position adjustment of the mold 10 and the substrate 1 in a state where the viscoelasticity of the imprint material 60 is low. Thus, it is possible to improve the accuracy of the position adjustment of the mold 10 and the substrate 1. It is desirable that the start time of the preliminary exposure of the shot region including the outer periphery of the substrate 1 should be 5% or more earlier than the start time of the preliminary exposure of the shot region that does not include the outer periphery of the substrate 1, in a case where the emission time of the preliminary exposure of the shot region that does not include the outer periphery of the substrate 1 is 100%.

Figure 5:
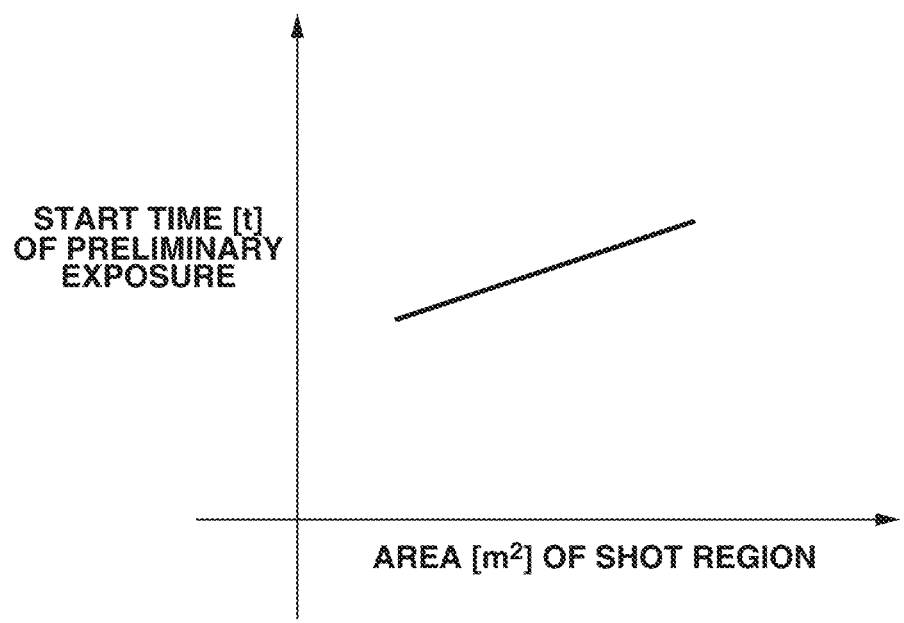
FIG. 5 is a diagram illustrating a relationship between an area of a shot region and a start time of preliminary exposure.

One of methods for determining the start time of the preliminary exposure of the shot region including the outer periphery of the substrate 1 is a method for determining the start time of the preliminary exposure depending on the area of the shot region including the outer periphery of the substrate 1. FIG. 5 illustrates the relationship between the area of the shot region including the outer periphery of the substrate 1 and the start time of the preliminary exposure. The smaller the area of the shot region including the outer periphery of the substrate 1 is, the earlier the start time of the preliminary exposure is.

The relationship between the area of the shot region including the outer periphery of the substrate 1 and the start time of the preliminary exposure is represented, for example, by formula 1:

$$tsPF = k1(aPF - aFF) + tsFF, \quad (1)$$

where tsPF represents the start time of the preliminary exposure of the shot region including the outer periphery of the substrate 1, and tsFF represents the start time of the preliminary exposure of the shot region that does not include the outer periphery of the substrate 1. Further, aPF represents the area of the shot region including the outer periphery of the substrate 1, aFF represents the area of the shot region that does not include the outer periphery of the substrate 1, and k1 represents the slope of the graph illustrated in FIG. 5. This can make the start time of the preliminary exposure of the shot region including the outer periphery of the substrate 1 early depending on the area of the shot region. Thus, it is possible to easily adjust the viscoelasticity of the imprint material 60 on the shot region including the outer periphery of the substrate 1.

Figure 6:
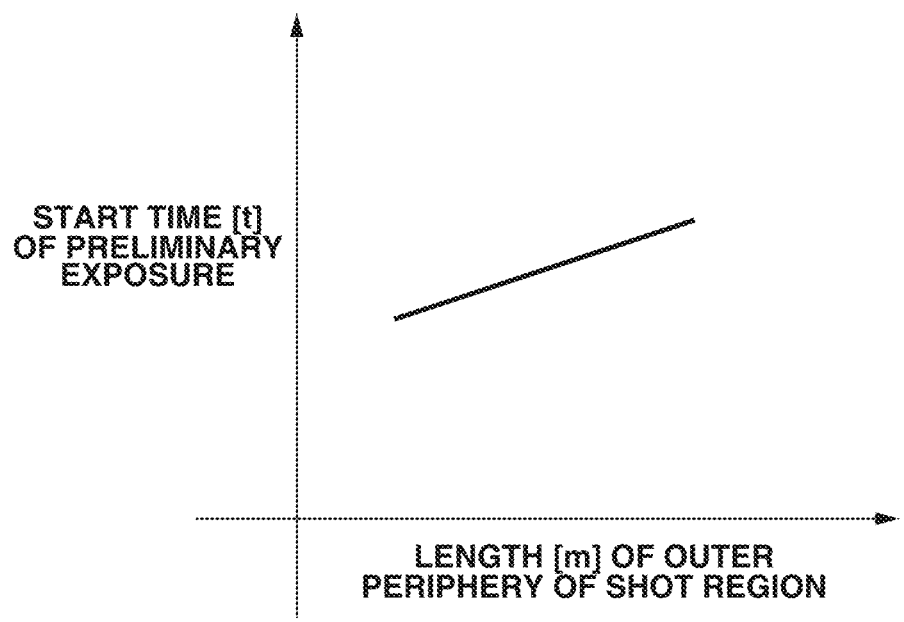
FIG. 6 is a diagram illustrating a relationship between a length of an outer periphery of the shot region and the start time of the preliminary exposure.

Alternatively, as one of the methods for determining the start time of the preliminary exposure of the shot region including the outer periphery of the substrate 1, the start time of the preliminary exposure may be determined depending on the length of the outer periphery of the shot region including the outer periphery of the substrate 1. FIG. 6 illustrates the relationship between the length of the outer periphery of the shot region including the outer periphery of the substrate 1 and the start time of the preliminary exposure. The shorter the length of the outer periphery of the shot region including the outer periphery of the substrate 1 is, the earlier the start time of the preliminary exposure is.

The relationship between the length of the outer periphery of the shot region including the outer periphery of the substrate 1 and the start time of the preliminary exposure is represented, for example, by formula 2:

$$tsPF = k2(bPF - bFF) + tsFF, \quad (2)$$

where tsPF represents the start time of the preliminary exposure of the shot region including the outer periphery of the substrate 1, and tsFF represents the start time of the preliminary exposure of the shot region that does not include the outer periphery of the substrate 1. Further, bPF represents the length of the outer periphery of the shot region including the outer periphery of the substrate 1, bFF represents the length of the outer periphery of the shot region that does not include the outer periphery of the substrate 1, and k2 represents the slope of the graph illustrated in FIG. 6. This can adjust the start time of the preliminary exposure of the shot region including the outer periphery of the substrate 1 depending on the length of the outer periphery of the shot region. Thus, it is possible to easily adjust the viscoelasticity of the imprint material 60 on the shot region including the outer periphery of the substrate 1.

Next, an imprint method according to a second exemplary embodiment is described with reference to FIGS. 7A and 7B. In the imprint method according to the second exemplary embodiment, similarities to the first exemplary embodiment are not described, and the differences from the first exemplary embodiment are described.

Figure 7A:
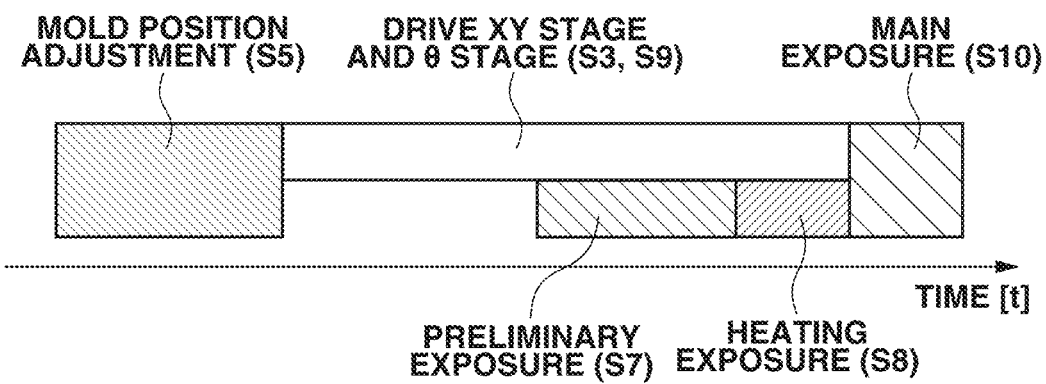
FIGS. 7A and 7B are diagrams each illustrating a time series of an imprint process according to a second exemplary embodiment.
Figure 7B:
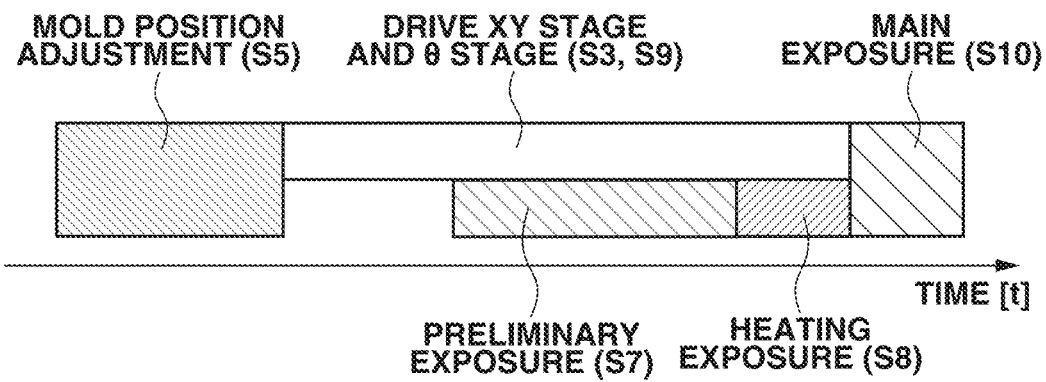

FIGS. 7A and 7B each illustrate the time series of a part of the imprint process according to the second exemplary embodiment. FIG. 7A is a diagram illustrating the time series of a case where the imprint process is performed on a shot region that does not include the outer periphery of the substrate 1. FIG. 7B is a diagram illustrating the time series of a case where the imprint process is performed on a shot region including the outer periphery of the substrate 1.

In the second exemplary embodiment, as illustrated in FIGS. 7A and 7B, the start time of the preliminary exposure of the shot region including the outer periphery of the substrate 1 (step S7 in FIG. 7B) is earlier than the start time of the preliminary exposure of the shot region that does not include the outer periphery of the substrate 1 (step S7 in FIG. 7A). Further, the emission time of the preliminary exposure of the shot region including the outer periphery of the substrate 1 is longer than the emission time of the preliminary exposure of the shot region that does not include the outer periphery of the substrate 1. This promotes curing of the imprint material 60 more on the shot region including the outer periphery of the substrate 1 than on the shot region that does not include the outer periphery of the substrate 1, and thus reduces the relative vibration between the mold 10 and the substrate 1. This can also reduce a dramatic decrease in the accuracy of the position adjustment of the mold 10 and the substrate 1 immediately after the main exposure (step S10) due to the extension of the substrate 1 caused by the heat of the main exposure. It is desirable that the emission time of the preliminary exposure of the shot region including the outer periphery of the substrate 1 should be 5% or more longer than the emission time of the preliminary exposure of the shot region that does not include the outer periphery of the substrate 1, in a case where the emission time of the preliminary exposure of the shot region that does not include the outer periphery of the substrate 1 is 100%.

Figure 8:
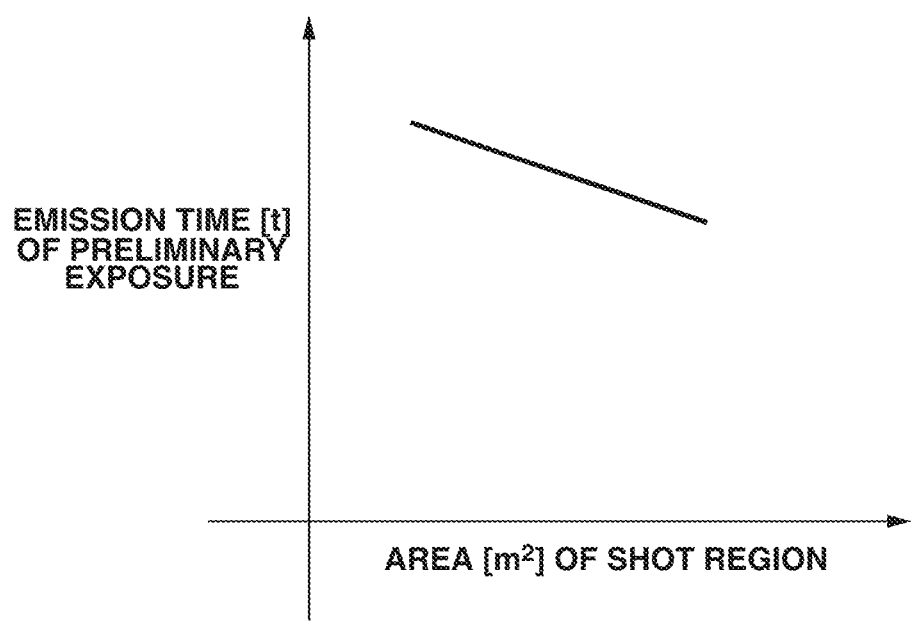
FIG. 8 is a diagram illustrating a relationship between an area of a shot region and an emission time of preliminary exposure.

One of methods for determining the emission time of the preliminary exposure of the shot region including the outer periphery of the substrate 1 is a method for determining the emission time of the preliminary exposure depending on the area of the shot region including the outer periphery of the substrate 1. FIG. 8 illustrates the relationship between the area of the shot region including the outer periphery of the substrate 1 and the emission time of the preliminary exposure. The smaller the area of the shot region including the outer periphery of the substrate 1 is, the longer the emission time of the preliminary exposure is.

The relationship between the area of the shot region including the outer periphery of the substrate 1 and the emission time of the preliminary exposure is represented, for example, by formula 3:

$$tPF = -k3(aPF - aFF) + tFF, \quad (3)$$

where tPF represents the emission time of the preliminary exposure of the shot region including the outer periphery of the substrate 1, and tFF represents the emission time of the preliminary exposure of the shot region that does not include the outer periphery of the substrate 1. Further, aPF represents the area of the shot region including the outer periphery of the substrate 1, aFF represents the area of the shot region that does not include the outer periphery of the substrate 1, and −k3 represents the slope of the graph illustrated in FIG. 8. This can adjust the emission time of the preliminary exposure of the shot region including the outer periphery of the substrate 1 depending on the area of the shot region. Thus, it is possible to easily adjust the viscoelasticity of the imprint material 60 on the shot region including the outer periphery of the substrate 1.

Figure 9:
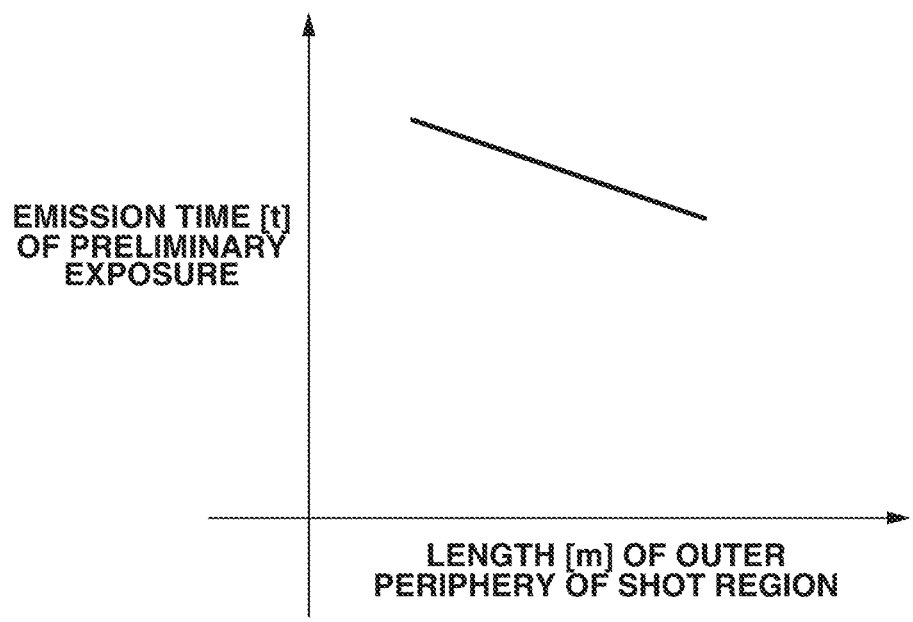
FIG. 9 is a diagram illustrating a length of an outer periphery of the shot region and the emission time of the preliminary exposure.

Alternatively, as one of the methods for determining the emission time of the preliminary exposure of the shot region including the outer periphery of the substrate 1, the emission time of the preliminary exposure may be determined depending on the length of the outer periphery of the shot region including the outer periphery of the substrate 1. FIG. 9 illustrates the relationship between the length of the outer periphery of the shot region including the outer periphery of the substrate 1 and the emission time of the preliminary exposure. The shorter the length of the outer periphery of the shot region including the outer periphery of the substrate 1 is, the longer the emission time of the preliminary exposure is.

The relationship between the length of the outer periphery of the shot region including the outer periphery of the substrate 1 and the emission time of the preliminary exposure is represented, for example, by formula 4:

$$tPF = -k4(bPF - bPF) + tff, \quad (4)$$

where tPF represents the emission time of the preliminary exposure of the shot region including the outer periphery of the substrate 1, and tFF represents the emission time of the preliminary exposure of the shot region that does not include the outer periphery of the substrate 1. Further, bPF represents the length of the outer periphery of the shot region including the outer periphery of the substrate 1, bFF represents the length of the outer periphery of the shot region that does not include the outer periphery of the substrate 1, and −k4 represents the slope of the graph illustrated in FIG. 9. This can adjust the emission time of the preliminary exposure of the shot region including the outer periphery of the substrate 1 depending on the length of the outer periphery of the shot region. Thus, it is possible to easily adjust the viscoelasticity of the imprint material 60 on the shot region including the outer periphery of the substrate 1.

In the description of the above exemplary embodiments, the start time or the emission time of the preliminary exposure for increasing the viscoelasticity of the imprint material 60 is changed without changing the illuminance of the preliminary exposure between the shot region that does not include the outer periphery of the substrate 1 and the shot region including the outer periphery of the substrate 1. In an imprint method according to a third exemplary embodiment, the illuminance of the preliminary exposure of a shot region including the outer periphery of the substrate 1 is set to be greater than the illuminance of the preliminary exposure of a shot region that does not include the outer periphery of the substrate 1. This can enhance the viscoelasticity of the imprint material 60 on the shot region including the outer periphery of the substrate 1 in a shorter time. It is thereby possible to prevent the time required for the imprint process on the shot region including the outer periphery of the substrate 1 from being longer than the time required for the imprint process on the shot region that does not include the outer periphery of the substrate 1, and improve the throughput of the imprint apparatus.

(Regarding Irradiation Region for Preliminary Exposure)

With reference to FIGS. 10A and 10B, the shape of the irradiation region for the preliminary exposure (a viscoelasticity increase step) of each shot region is described. As illustrated in FIGS. 10A and 10B, a shape of the irradiation region for the preliminary exposure in the above exemplary embodiments can be a frame shape in each shot region. FIG. 10A illustrates a frame-shaped irradiation region for the preliminary exposure of a shot region that does not include the outer periphery of the substrate 1. FIG. 10B illustrates a frame-shaped irradiation region for the preliminary exposure of a shot region including the outer periphery of the substrate 1. Consequently, the preliminary exposure is performed, whereby it is possible to not only heighten the viscoelasticity of the imprint material 60 and reduce the relative vibration between the mold 10 and the substrate 1, but also prevent the imprint material 60 from coming out of the shot region (the pattern region P of the mold 10).

The shape of the irradiation region for the preliminary exposure may be not only a frame shape but also another shape with respect to the shot region. For example, in a case where the preliminary exposure is performed to increase the viscoelasticity and improve the accuracy of overlay, the irradiation region can be determined such that a partial region of the shot region is preliminarily exposed. Alternatively, the illuminance or the emission time may be adjusted in the entirety of the shot region, and the preliminary exposure may be performed.

The imprint apparatus has been described above regarding an imprint method for curing an imprint material using a light curing method. The present exemplary embodiment, however, is not limited to the light curing method. Alternatively, a method for curing an imprint material using heat may be employed. In the light curing method, an ultraviolet-curable resin is used and cured by being irradiated with ultraviolet light in the state where a mold is pressed against a substrate via the resin. The mold is then pulled away from the cured resin so that a pattern is formed. In the present exemplary embodiment, ultraviolet light is emitted as curing light. The wavelength of the light, however, can be appropriately determined depending on the imprint material 60 supplied onto the substrate 1. In contrast, in the method using heat, fluidity of a thermoplastic resin is heightened by heating the resin to a temperature at or above the glass-transition temperature, and a mold is pressed against a substrate via the resin. After the resin is cooled, the mold is pulled away from the resin, thereby forming a pattern.

(Method for Manufacturing Article)

A pattern of a cured product formed by an imprint apparatus is permanently used in at least a part of each of various articles, or temporarily used to manufacture each of various articles. Examples of the article include an electric circuit element, an optical element, microelectromechanical systems (MEMS), a recording element, a sensor, and a mold. Examples of the electric circuit element include volatile or non-volatile semiconductor memories such as a dynamic random-access memory (DRAM), a static random-access memory (SRAM), a flash memory, and a magnetoresistive random-access memory (MRAM). The examples also include semiconductor devices such as a large-scale integration (LSI) device, a charge-coupled device (CCD), an image sensor, and a field-programmable gate array (FPGA). Examples of the mold include a mold for imprint.

The pattern of the cured product is used as it is as a component member of at least a part of the article, or temporarily used as a resist mask. After etching or ion implantation is performed in the step of processing a substrate, the resist mask is removed.

Figure 11A:
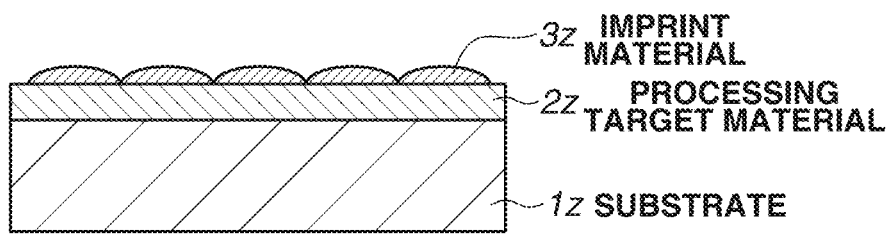
FIGS. 11A to 11F are diagrams illustrating a method for manufacturing an article.

Next, a specific method for manufacturing an article is described. As illustrated in FIG. 11A, a substrate $1z$ such as a silicon wafer, on the surface of which a processing target material $2z$ such as an insulator is formed, is prepared. An imprint material $3z$ is then applied to the surface of the processing target material $2z$ by, for example, an inkjet method. FIG. 11A illustrates the state where the imprint material $3z$ in the form of a plurality of droplets is applied onto the substrate $1z$.

Figure 11B:
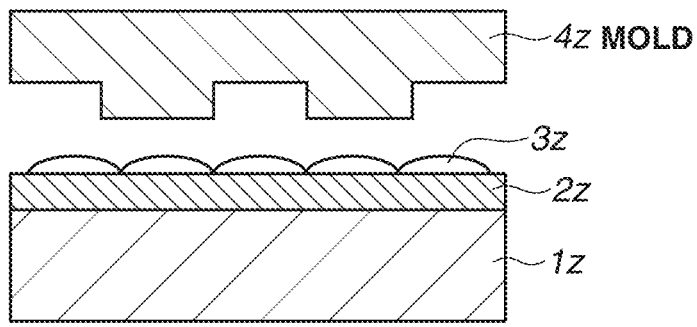
Figure 11C:
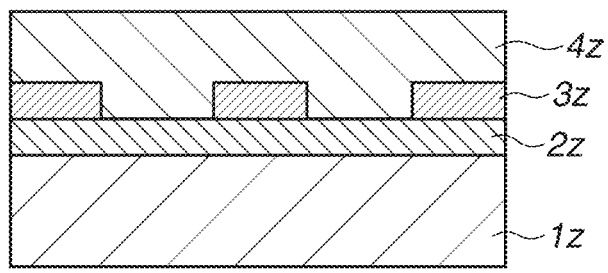

As illustrated in FIG. 11B, the side of an imprint mold $4z$ where a concave-convex pattern is formed is directed and opposed to the imprint material $3z$ on the substrate $1z$. As illustrated in FIG. 11C, the substrate $1z$ onto which the imprint material $3z$ is applied and the mold $4z$ are brought into contact with each other, and pressure is applied to the imprint material $3z$ and the mold $4z$. The imprint material $3z$ fills the gap between the mold $4z$ and the processing target material $2z$. When light as curing energy is emitted through the mold $4z$ to the imprint material $3z$ in this state, the imprint material $3z$ cures.

Figure 11D:
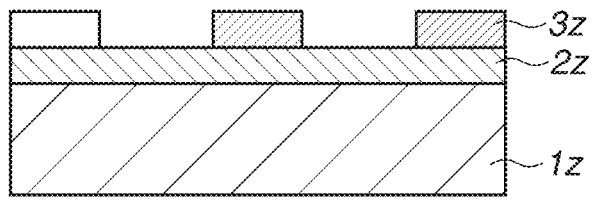

As illustrated in FIG. 11D the mold $4z$ and the substrate $1z$ are pulled away from each other after the imprint material $3z$ is cured, and the pattern of a cured product of the imprint material $3z$ is formed on the substrate $1z$. This pattern of the cured product has such a shape that a recessed portion of the mold $4z$ corresponds to a protruding portion of the cured product, and a protruding portion of the mold $4z$ corresponds to a recessed portion of the cured product. That is, the concave-convex pattern of the mold $4z$ is transferred to the imprint material $3z$.

Figure 11E:
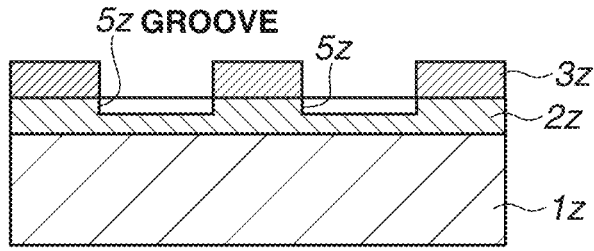
Figure 11F:
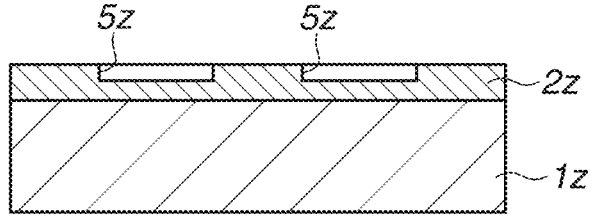

As illustrated in FIG. 11E, when etching is performed using the pattern of the cured product as an etching-resistant mask, a portion where the cured product is not present or thinly remains in the surface of the processing target material $2z$ is removed, and thereby grooves $5z$ is formed. As illustrated in FIG. 11F, when the pattern of the cured product is removed, an article in which the grooves $5z$ are formed on the surface of the processing target material $2z$ can be obtained. In this case, the pattern of the cured product is removed. Alternatively, the pattern of the cured product may not be removed even after the processing, and may be used as, for example, an interlayer insulating film included in a semiconductor device, i.e., a component member of the article. The method for manufacturing an article according to the present exemplary embodiment has an advantage over a conventional method in at least one of performance, quality, productivity, and a production cost of the article.

While the desirable exemplary embodiments of the present invention have been described above, the present invention is not limited to these exemplary embodiments, but can be modified and changed in various manners within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-102882, filed May 31, 2019, which is hereby incorporated by reference herein in its entirety.

What is claimed is:

1. An imprint method for forming a pattern of an imprint material on a substrate using a mold, the imprint method comprising:

bringing the mold and the imprint material supplied onto the substrate into contact with each other;
enhancing viscoelasticity of the imprint material;
making position adjustment of the mold and the substrate; and
curing the imprint material,
wherein the imprint material is supplied onto a shot region of the substrate, and time after bringing the mold into contact with the imprint material and before starting enhancing the viscoelasticity is shorter when the shot region includes an outer periphery of the substrate than when the shot region does not include the outer periphery of the substrate, and
wherein the outer periphery of the substrate is an edge region of the substrate and a shot region including the outer periphery of the substrate is a partial shot region.

2. The imprint method according to claim 1, wherein in the viscoelasticity enhancing, light is emitted to the imprint material so that the viscoelasticity of the imprint material is enhanced.

3. The imprint method according to claim 1, wherein in the imprint material curing, light is emitted to the imprint material so that the imprint material is cured.

4. The imprint method according to claim 1, wherein in the viscoelasticity enhancing, light is emitted to a frame-shaped irradiation region in each of the shot regions.

5. The imprint method according to claim 1, wherein the time between bringing the mold into contact with the imprint material and starting enhancing the viscoelasticity changes depending on an area of the shot region including the outer periphery of the substrate.

6. The imprint method according to claim 5, wherein the smaller the area of the shot region including the outer periphery of the substrate is, the shorter the time between bringing the mold into contact with the imprint material and starting enhancing the viscoelasticity is.

7. The imprint method according to claim 1, wherein the time between bringing the mold into contact with the imprint material and starting enhancing the viscoelasticity changes depending on a length of an outer periphery of the shot region that including the outer periphery of the substrate.

8. The imprint method according to claim 7, wherein the shorter the length of the outer periphery of the shot region including the outer periphery of the substrate is, the shorter the time between bringing the mold into contact with the imprint material and starting enhancing the viscoelasticity is.

9. The imprint method according to claim 1,
wherein enhancing includes enhancing the viscoelasticity of the imprint material using light, and
wherein light for enhancing the viscoelasticity of the imprint material and light for curing the imprint material are generated from respective light sources that are different from each other.

10. The imprint method according to claim 1, wherein time for enhancing viscoelasticity of the imprint material is set such that relative vibrations between the mold and the substrate are reduce and overlay accuracy is improve.

11. An imprint method for forming a pattern of an imprint material on a substrate using a mold, the imprint method comprising:
bringing the mold and the imprint material supplied onto the substrate into contact with each other;
enhancing viscoelasticity of the imprint material;
making position adjustment of the mold and the substrate; and
curing the imprint material,
wherein time for enhancing the viscoelasticity on a shot region that includes an outer periphery of the substrate is longer than time for enhancing the viscoelasticity on a shot region that does not include the outer periphery of the substrate.

12. The imprint method according to claim 11, wherein in the viscoelasticity enhancing, light is emitted to the imprint material so that the viscoelasticity of the imprint material is enhanced.

13. The imprint method according to claim 11, wherein in the imprint material curing, light is emitted to the imprint material so that the imprint material is cured.

14. The imprint method according to claim 11, wherein in the viscoelasticity enhancing, light is emitted to a frame-shaped irradiation region in each of the shot regions.

15. The imprint method according to claim 11, wherein the time for enhancing the viscoelasticity on the shot region including the outer periphery of the substrate changes depending on an area of the shot region including the outer periphery of the substrate.

16. The imprint method according to claim 15, wherein the smaller the area of the shot region including the outer periphery of the substrate is, the longer the time for enhancing the viscoelasticity is.

17. The imprint method according to claim 11, wherein the time for enhancing the viscoelasticity on the shot region including the outer periphery of the substrate changes depending on a length of an outer periphery of the shot region including the outer periphery of the substrate.

18. The imprint method according to claim 17, wherein the shorter the length of the outer periphery of the shot region including the outer periphery of the substrate is, the longer the time for enhancing the viscoelasticity is.

19. The imprint method according to claim 11,
wherein enhancing includes enhancing the viscoelasticity of the imprint material using light, and
wherein light for enhancing the viscoelasticity of the imprint material and light for curing the imprint material are generated from respective light sources that are different from each other.

20. A method for manufacturing an article, the method comprising:
molding a composition on a substrate using an imprint method for forming a pattern of an imprint material on the substrate using a mold; and
processing the substrate on which the composition is molded,
wherein the imprint method includes:
bringing the mold and the imprint material supplied onto the substrate into contact with each other,
enhancing viscoelasticity of the imprint material,
making position adjustment of the mold and the substrate, substrate; and
curing the imprint material,
wherein the imprint material is supplied onto a shot region of the substrate, and time after bringing the mold into contact with the imprint material and before starting enhancing the viscoelasticity is shorter when the shot region includes an outer periphery of the substrate than when the shot region does not include the outer periphery of the substrate.

21. The imprint method according to claim 20,
wherein enhancing includes enhancing the viscoelasticity of the imprint material using light, and wherein light for enhancing the viscoelasticity of the imprint material and light for curing the imprint material are generated from respective light sources that are different from each other.

* * * * *